United States Patent [19]

Ikenaga et al.

[11] Patent Number: 5,301,199
[45] Date of Patent: Apr. 5, 1994

[54] BUILT-IN SELF TEST CIRCUIT

[75] Inventors: Takeshi Ikenaga; Jun-ichi Takahashi, both of Kanagawa, Japan

[73] Assignee: Nippon Telegraph and Telephone Corporation, Japan

[21] Appl. No.: 991,535

[22] Filed: Dec. 15, 1992

[30] Foreign Application Priority Data

Dec. 16, 1991 [JP] Japan .................................. 3-332300
Mar. 5, 1992 [JP] Japan .................................. 4-83201

[51] Int. Cl.$^5$ .......................................... H04B 17/00
[52] U.S. Cl. ................................ 371/22.5; 371/22.4; 371/25.1
[58] Field of Search ............... 371/22.5, 25.1, 22.4, 371/22.1, ; 395/500

[56] References Cited

U.S. PATENT DOCUMENTS

| | | | |
|---|---|---|---|
| 4,503,537 | 3/1985 | McAnney | 371/25 |
| 4,670,877 | 6/1987 | Nishibe | 371/15.1 |
| 4,847,839 | 7/1989 | Hudson, Jr. et al. | 371/25.1 |
| 4,903,266 | 2/1990 | Hack | 371/22.2 |
| 5,033,048 | 7/1991 | Pierce et al. | 371/21.2 |
| 5,051,996 | 9/1991 | Bergeson et al. | 371/25.1 |
| 5,051,997 | 9/1991 | Sakashita et al. | 371/22.5 |
| 5,138,619 | 8/1992 | Fasang et al. | 371/21.1 |
| 5,142,222 | 8/1992 | Tamaka et al. | 371/22.5 |
| 5,173,906 | 12/1992 | Dreibelbis et al. | 371/22.5 |
| 5,184,067 | 2/1993 | Nozuyama | 371/22.4 |
| 5,202,978 | 5/1993 | Nozuyama | 395/500 |

OTHER PUBLICATIONS

Implementing a Built-In Self-test PLA Design Robert Treuer, Hideo Fugiwara and Vinod K. Agarwal McGill University May 1985 pp. 37-48.
Patrick P. Gelsinger, "Design and Test of the 80386" published by IEEE Design & Test, Jun. 1987, pp. 42-50.
Sudhakar M. Reddy and et al., "A Data Compression Technique for Built-In Self-Test" published by IEEE Transactions on Computers, vol. 37, No. 9, Sep. 1988, pp. 1151-1156.
Laung-Terng Wang et al., "Linear Feedback Shift Register Design Using Cyclic Codes" published by IEEE Transactions on Computers, vol. 37, No. 10, Oct. 1988, pp. 1302-1306.

Primary Examiner—Robert W. Beausoliel, Jr.
Assistant Examiner—Albert Decady
Attorney, Agent, or Firm—Blakely, Sokoloff, Taylor & Zafman

[57] ABSTRACT

A built-in self test circuit includes a pattern generator, a functional block subjected to a self test on the basis of an output from the pattern generator, a space compressor for compressing a test result of the functional block, and a comparator for comparing an output from the space compressor with an expected value and outputting a comparison result. The functional block has O (positive integer) inputs and M (positive integer) outputs. The pattern generator is constituted by a linear feedback shift register, having an output bit width P (P=O/N) which is 1/N of the inputs O of the functional block, for generating a pseudorandom pattern and an iterative pseudorandom pattern output unit for distributing outputs from the linear feedback shift register in units of N outputs and outputting, to the functional block, an iterative pseudorandom pattern output having an iterative O-bit width (O=P*N) of the pseudorandom pattern output from the linear feedback shift register every P bits. The space compressor has a function of spatially compressing the M outputs from the functional block into L outputs (positive integer and M>L). The pattern generator, the functional block, the space compressor, and the comparator are built into a semiconductor chip into which other functional elements are built.

10 Claims, 9 Drawing Sheets

BUILT-IN SELF TEST CIRCUIT

BACKGROUND OF THE INVENTION

The present invention relates to a built-in self test circuit.

In recent years, it is considerably important to perform a test having a high fault detection capacity so as to assure the quality of LSIs. It is, however, more difficult to test the internal arrangement of an LSI from the limited external pins due to the recent development of larger scale LSIs. In addition, the test contents are also complicated. A test circuit itself is assumed to be built into an LSI in design for testability (DFT). Typical techniques are a built-in self test (BIST) technique and a scan technique. The present invention relates to the BIST technique.

In this BIST technique, a built-in self test is known wherein a test function is built into a semiconductor chip to perform a test. Built-in self test arrangements are classified into a centralized arrangement in which one pattern generator and one pattern compressor are shared by all functional blocks and a distributed arrangement in which a pattern generator and a pattern compressor are arranged for each functional block.

With this arrangement, the number of parts of each constituent component or the wiring amount between the respective constituent components greatly influence the hardware amount or space factor in the LSI.

For example, a pseudorandom pattern generator is generally used as a pattern generator. Typical examples of the pseudorandom pattern generator are a linear feedback shift register and a weighted linear shift register. In use of a linear feedback shift register having a bit width corresponding to the number of inputs of circuits under test (CUT), a pseudorandom pattern is generated by the linear feedback shift register, and the output from the linear feedback shift register is input to the circuits under test.

In the method using the linear feedback shift register or weighted linear feedback shift register as the test pattern generator, however, the linear feedback shift register having the bit width corresponding to the number of inputs of the circuits under test must be used, and a large amount of hardware is required for a multiple input circuit.

In addition, a large number of patterns and a long test execution time are required to obtain a high fault coverage in a linear feedback shift register. A long fault simulation time is undesirably required to evaluate the patterns accordingly.

The weighted linear feedback shift register has an advantage in that the number of patterns is reduced because convergence of the fault coverage is improved. However, weighting hardware such as OR and AND gates is additionally required, resulting in inconvenience.

When a pattern compressor is taken into consideration, two linear feedback shift registers (LFSRs) or multiple input linear feedback shift registers (MISRs) are used as the first and second compressors in the pattern compressor arrangement. In the first compressors, as shown in FIG. 10, pattern generators (LFSRs) $1_1$ to $1_4$ supply M test patterns to four functional blocks $2_1$ to $2_4$ as circuits under test, and data of N bits×M patterns output from the functional blocks $2_1$ to $2_4$ are spatially compressed into data of 1 bit×M patterns by space compressors $3_1$ to $3_4$ using the multiple input linear feedback shift registers (MISRs) embedded in the functional blocks (i.e., the functional blocks and the pattern compressors are arranged adjacent to each other in the chip layout, and the wiring length between them is short).

In the second compressors, all data each consisting of 1 bit×M patterns obtained by compressing the data from the functional blocks $2_1$ to $2_4$ by the space compressors $3_1$ to $3_4$ are respectively collected by compression lines $4_1$ to $4_4$, and time compressors $5_1$ to $5_4$ using the linear feedback shift registers (LFSRs) separate from the four functional blocks (the compressors are arranged separate from the functional blocks in the chip layout, and the wiring length between them is long) compress all the data into data each consisting of one pattern. The resultant values are compared with a given expected value prestored in the chip (Reference: P. P. Glelsinger: Design and test for the 80386, IEEE Design & Test of Comp., 4, 3, pp. 42–50 (1987)).

Since the multiple input linear feedback shift registers are used as the space compressors 3 ($3_1$ to $3_4$) as the first compressors for the functional blocks, and four separate linear feedback shift registers are used as time compressors 5 ($5_1$ to $5_4$) serving as the second compressors, the amount of hardware constituting the pattern compressor is undesirably large.

As an arrangement of the space compressor having a smaller amount of hardware than that of the compressor using the multiple input feedback shift registers, a compressor using exclusive OR gates is known (Reference: S. M. Reddy et al.: A data compression technique for built-in self-test, IEEE Trans. Comp., Col. 37, No. 9, pp. 1151–1156 (Sep. 1988)).

The degree of space compression (compressible bit width) free from missed faults depends on a functional block under test in the compressor using only the exclusive OR gates. This arrangement is suitable for a pattern compressor in which space and time compressors are located adjacent to each other to perform a centralized self test. However, when this arrangement is used as a distributed self test pattern compressor, a wiring amount between the space and time compressors is undesirably increased in the presence of a compressor having a low degree of space compression in the functional block under test.

SUMMARY OF THE INVENTION

It is, therefore, a principal object of the present invention to provide a built-in self test circuit capable of maintaining the same fault detection capacity as that of the conventional techniques and being arranged by a smaller amount of hardware than those of the conventional techniques.

In order to achieve the above object of the present invention, there is provided a built-in self test circuit comprising a pattern generator, a functional block subjected to a self test on the basis of an output from the pattern generator, a space compressor for compressing a test result of the functional block, and a comparator for comparing an output from the space compressor with an expected value and outputting a comparison result, wherein the functional block has 0 (positive integer) inputs and M (positive integer) outputs, the pattern generator is constituted by a linear feedback shift register, having an output bit width P (P=O/N) which is 1/N of the inputs O of the functional block, for generating a pseudorandom pattern and an iterative pseudorandom pattern output unit for distributing outputs from the linear feedback shift register in units of N outputs and outputting, to the functional block, an iterative pseudorandom pattern output having an iterative O-bit width (O=P*N) of the pseudorandom pattern output from the linear feedback shift register every P bits, the space compressor has a function of spatially compressing the M outputs from the functional block into L outputs (positive integer and M>L), and the pattern generator, the functional block, the space compressor, and the comparator are built into a semiconductor chip into which other functional elements are built.

DESCRIPTION OF THE PREFERRED EMBODIMENTS

Figure 1:
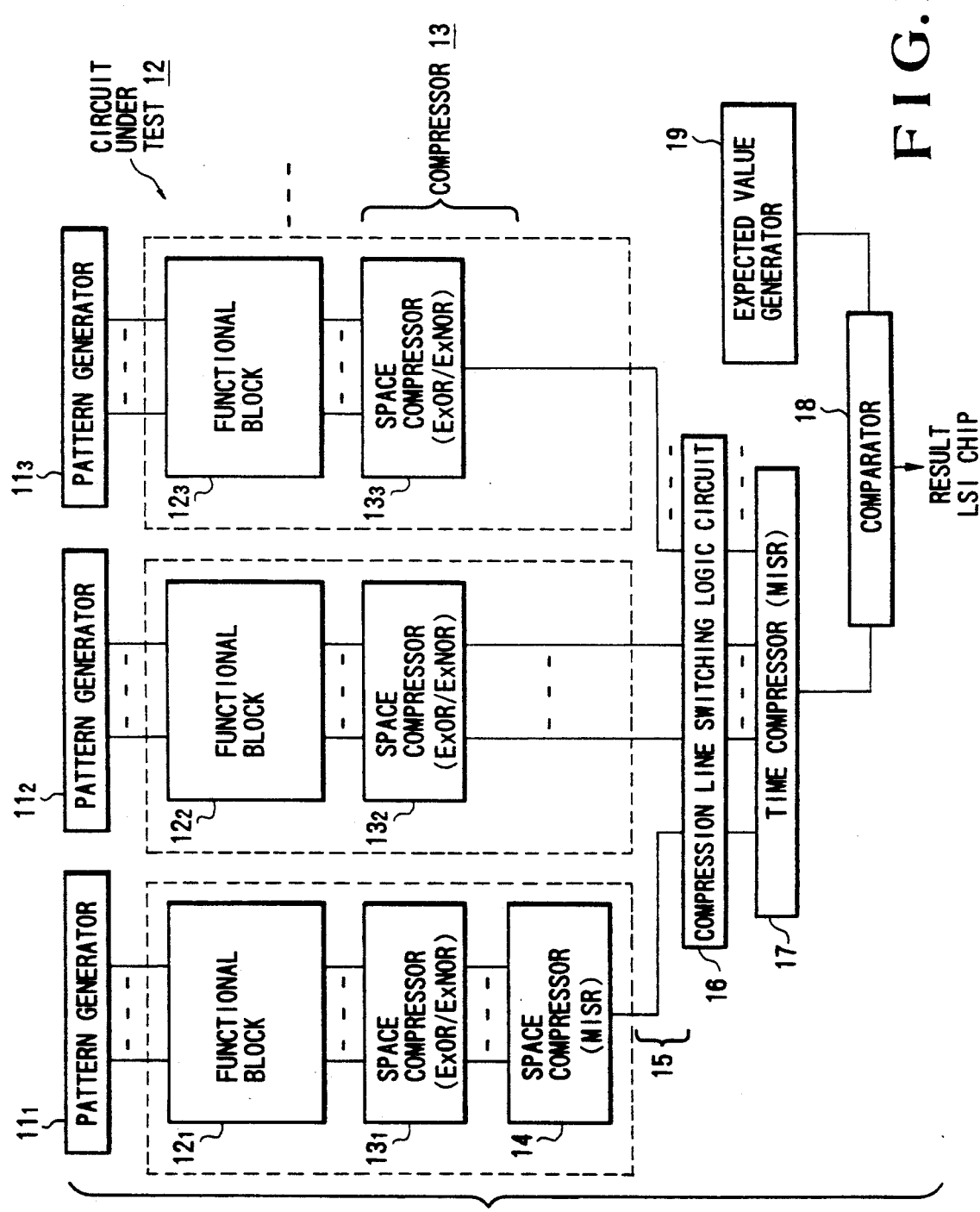
FIG. 1 is a block diagram showing an embodiment of a built-in self test circuit according to the present invention.

FIG. 1 shows an embodiment of a built-in self test circuit according to the present invention. Referring to FIG. 1, pattern generators 11 ($11_1$ to $11_3$) are constituted by a distributed type in which pattern generators are arranged in units of functional blocks, a centralized type in which pattern generators are distributed from one location using a bus or the like, or a mixed type in which the distributed and centralized pattern generators are mixed. The pattern generators 11 are built into a semiconductor chip in which other functional elements are arranged. The detailed arrangement is shown in FIG. 2.

Figure 2:
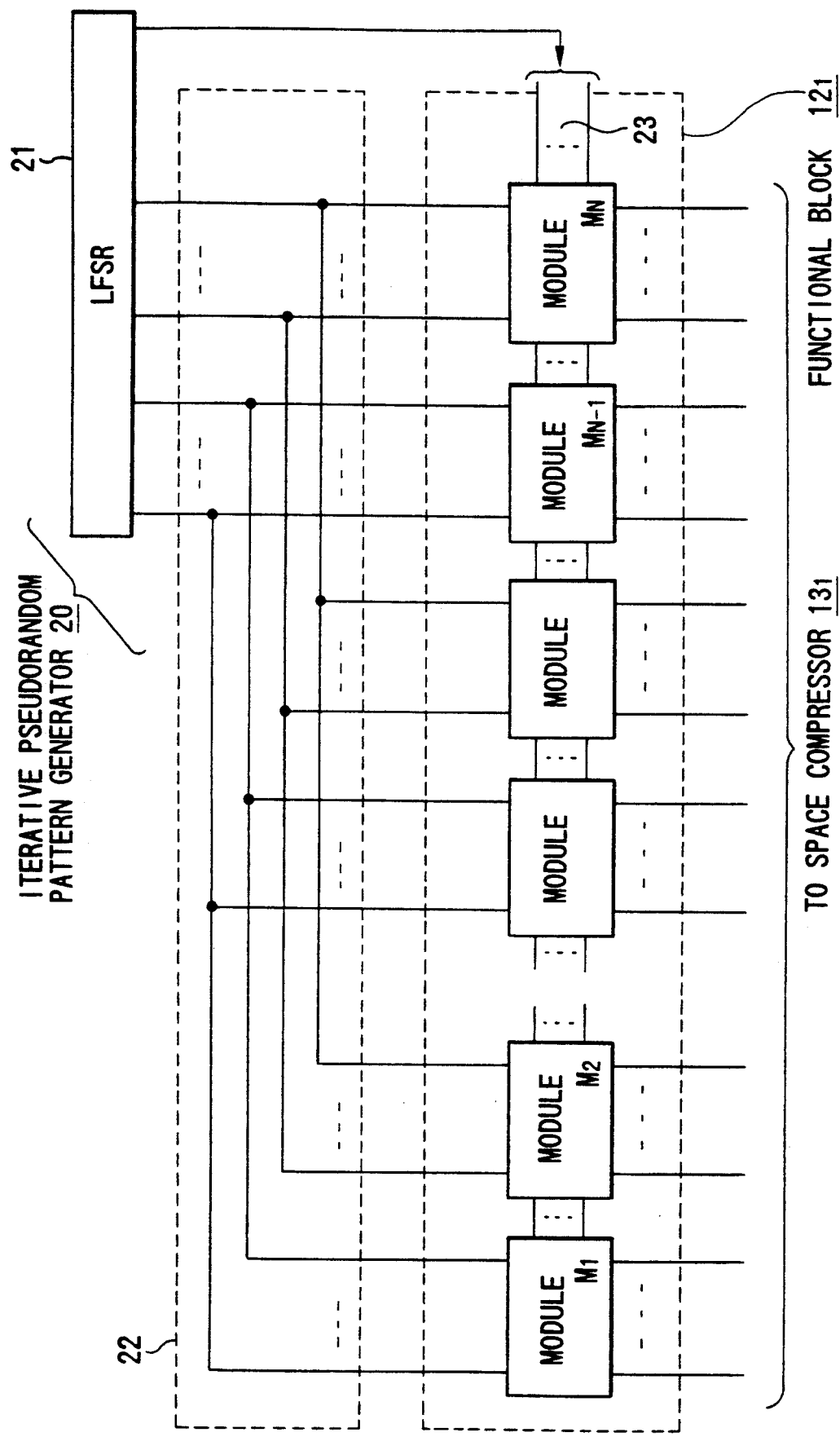
FIG. 2 is a block diagram showing an embodiment of a pattern generator shown in FIG. 1.

FIG. 2 shows an iterative pseudorandom pattern generator as an example of the pattern generator 11 in FIG. 1. A functional block as a circuit under test is constituted by a plurality of modules, and the pattern generator comprises a linear feedback shift register (LFSR) 21 for generating a pseudorandom pattern having an output bit width P which is 1/N (N is an integer of 2 or more: N=2, 3, 4, ...) of a number O of inputs supplied to data input units of the modules $M_1$ to $M_n$, and an iterative pseudorandom pattern output unit 22 for iteratively (N times) supplying the pseudorandom pattern generated by the linear feedback shift register (LFSR) 21 to the input units of the modules.

This iterative pseudorandom pattern generator distributes outputs into N data by the linear feedback shift register 21 for generating the pseudorandom pattern having the output bit pattern which is 1/N (N=2, 3, 4, ...) the number of inputs supplied to the data input units of the modules, and causes the iterative pseudorandom pattern output unit 22 to iteratively generate the pseudorandom pattern.

To iteratively input the iterative pseudorandom pattern generated by the iterative pseudorandom pattern generator to the data input units of the modules, the iterative pseudorandom pattern output unit 22 is coupled to the data input units of the modules to couple the iterative pseudorandom pattern generator to the modules as circuits under test.

The bit width of the linear feedback shift register 21 as the major component of the iterative pseudorandom pattern generator is so determined that the pseudorandom pattern generated by the linear feedback shift register (LFSR) 21 is not supplied to each of the iterative modules but is iteratively supplied to two or more modules due to the following reason. If a pseudorandom pattern is supplied in units of modules, each module can be tested, but a coupling test between the modules cannot be performed, thus causing an undetectable fault.

The final bit width of the linear feedback shift register 21 is determined to fall within an allowable value (95%) of the fault coverage preset in accordance with a missed fault coverage in a fault simulation.

The bit width of the linear feedback shift register 21 is increased by the number of control inputs, and the increased bit output is supplied to control input units 23 of the circuits under test without being distributed, thereby generating the pattern for the control input units 23 of the circuits under test.

A pattern generator including a linear feedback shift register and a counter in an arrangement different from that described above may be used to generate a pattern for the control input units 23 of the circuits under test.

Figure 3:
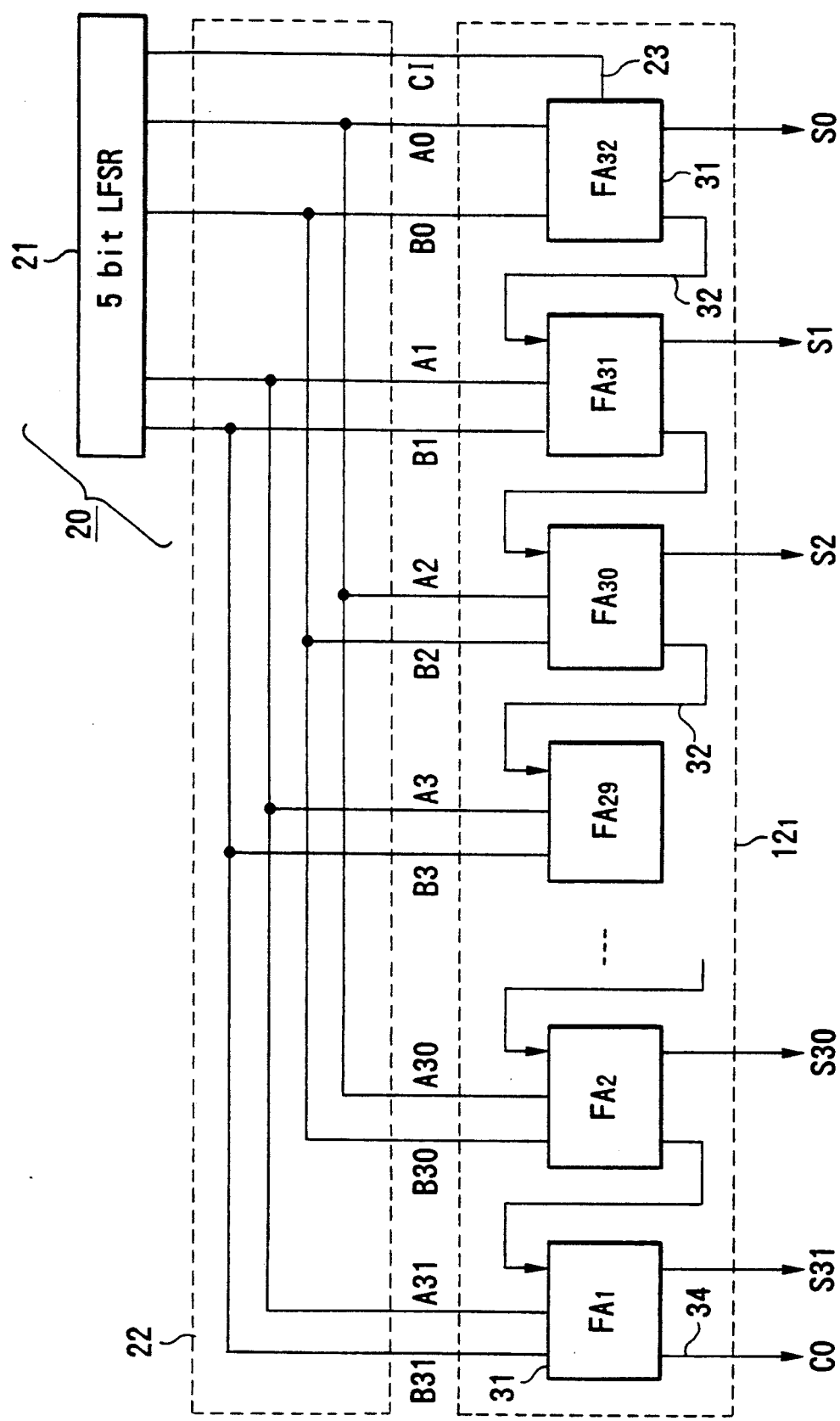
FIG. 3 is a circuit diagram showing a detailed arrangement of the pattern generator shown in FIG. 2.
Figure 6:
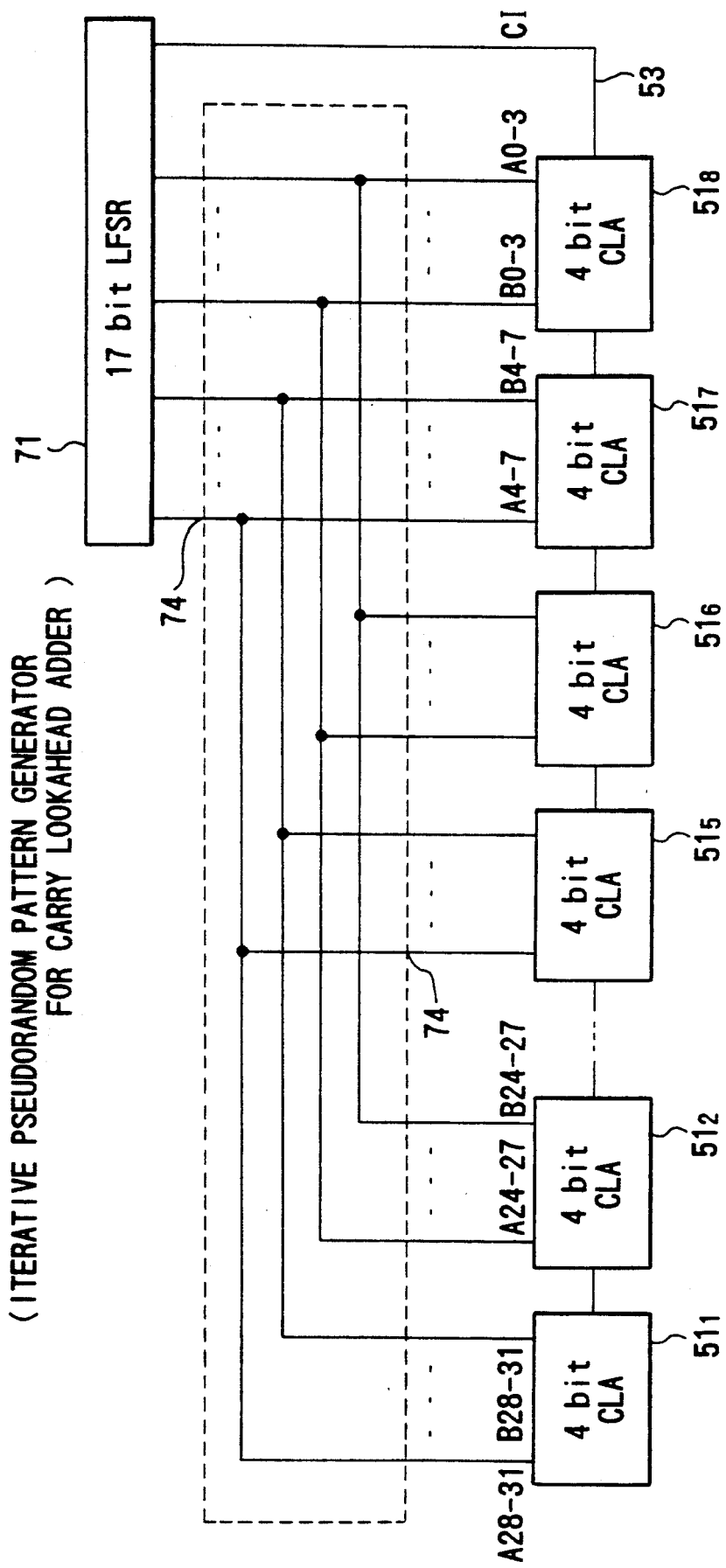
FIG. 6 is a circuit diagram showing an arrangement of a pattern generator using the arrangements of FIGS. 4 and 5.

Embodiments employing the circuits under test and the iterative pseudorandom pattern generator 20 as a 32-bit ripple carry adder and a 32-bit carry lookahead adder are shown in FIGS. 3 and 6 as typical circuits having an arrangement (FIG. 2) in which identical functional modules are linearly arranged and coupled to each other.

FIG. 3 explains circuits under test according to the first embodiment of the present invention.

This embodiment exemplifies the present invention applied to a ripple carry adder. As shown in FIG. 3, the 32-bit ripple carry adder model is constituted by thirty-two 3-input, 2-output full adder modules 31 arranged in line and coupled to each other through a single carry propagation line 32. The lowest module $31_{32}$ is connected to a carry input pin (CI) 23, and the highest module $31_1$ is connected to a carry output pin (CO) 34. Data input pins A0 to A31 and B0 to B31 are connected to the iterative pseudorandom pattern generator 20.

The iterative pseudorandom pattern generator 20 uses a 5-bit output linear feedback shift register (5-bit LFSR) 21. One of the five output bits of the shift register 21 is connected to the carry input pin 23, and the remaining four bits are used for the shift register, so that a pseudorandom pattern generated by the shift register 21 is iteratively supplied to the four data input units of the two full adder modules 31 through the iterative pseudorandom pattern output unit 22, as shown in FIG. 3.

The pseudorandom pattern is iteratively supplied every two full adder modules due to the following reason. When the pseudorandom pattern is iteratively supplied every full adder module, each full adder can be independently tested, but a coupling test between the full adders cannot be performed. Although this arrangement is advantageous in reduction in hardware, but an undetectable fault occurs.

The number of input bits of the 32-bit ripple carry adder is 65. If a normal pseudorandom pattern generator is used, a 65-bit pseudorandom pattern generator is required. However, when an iterative arrangement is utilized, only the 5-bit pseudorandom pattern generator is required.

Figure 4:
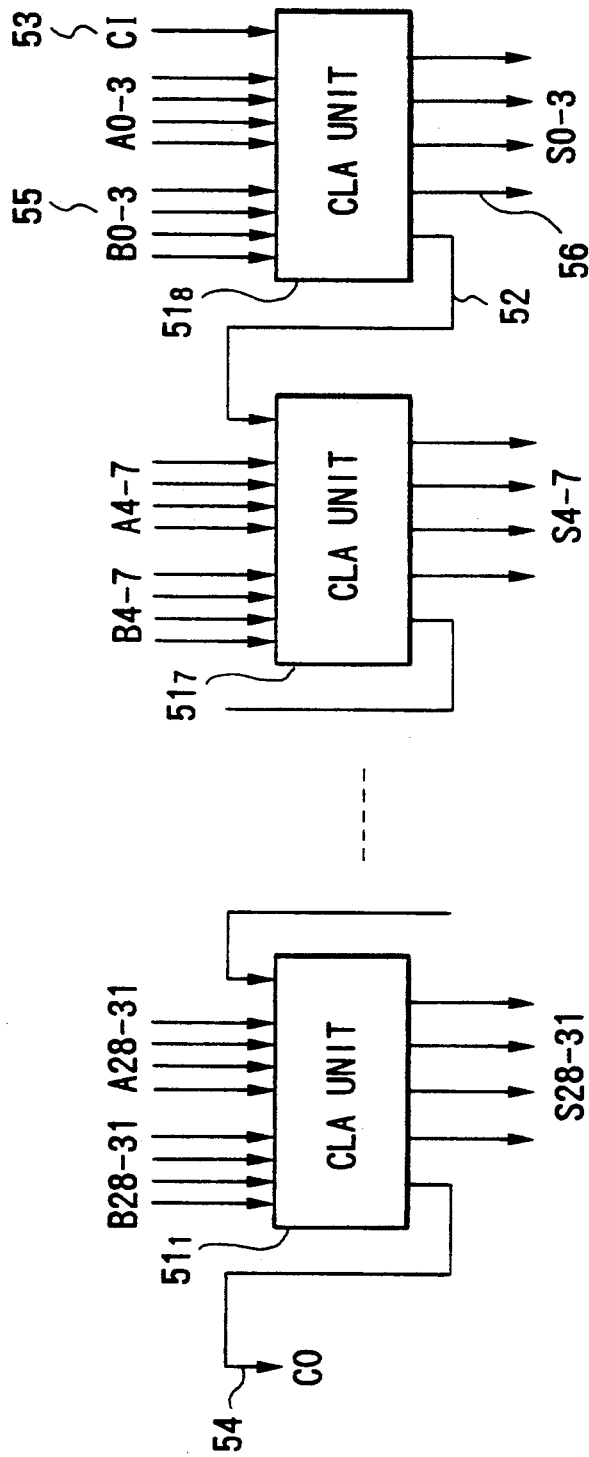
FIG. 4 is a diagram showing another embodiment of a pattern generator.

FIG. 4 explains a circuit under test according to the second embodiment of the present invention. This embodiment exemplifies the present invention applied to a carry lookahead adder.

FIG. 4 shows eight 4-bit carry lookahead adder units 51 as modules $51_1$ to $51_8$ coupled through a single carry propagation line 52. The lowest module $51_8$ is connected to a carry input pin (CI) 53, and the highest module $51_1$ is connected to a carry output pin (CO) 54.

Figure 5:
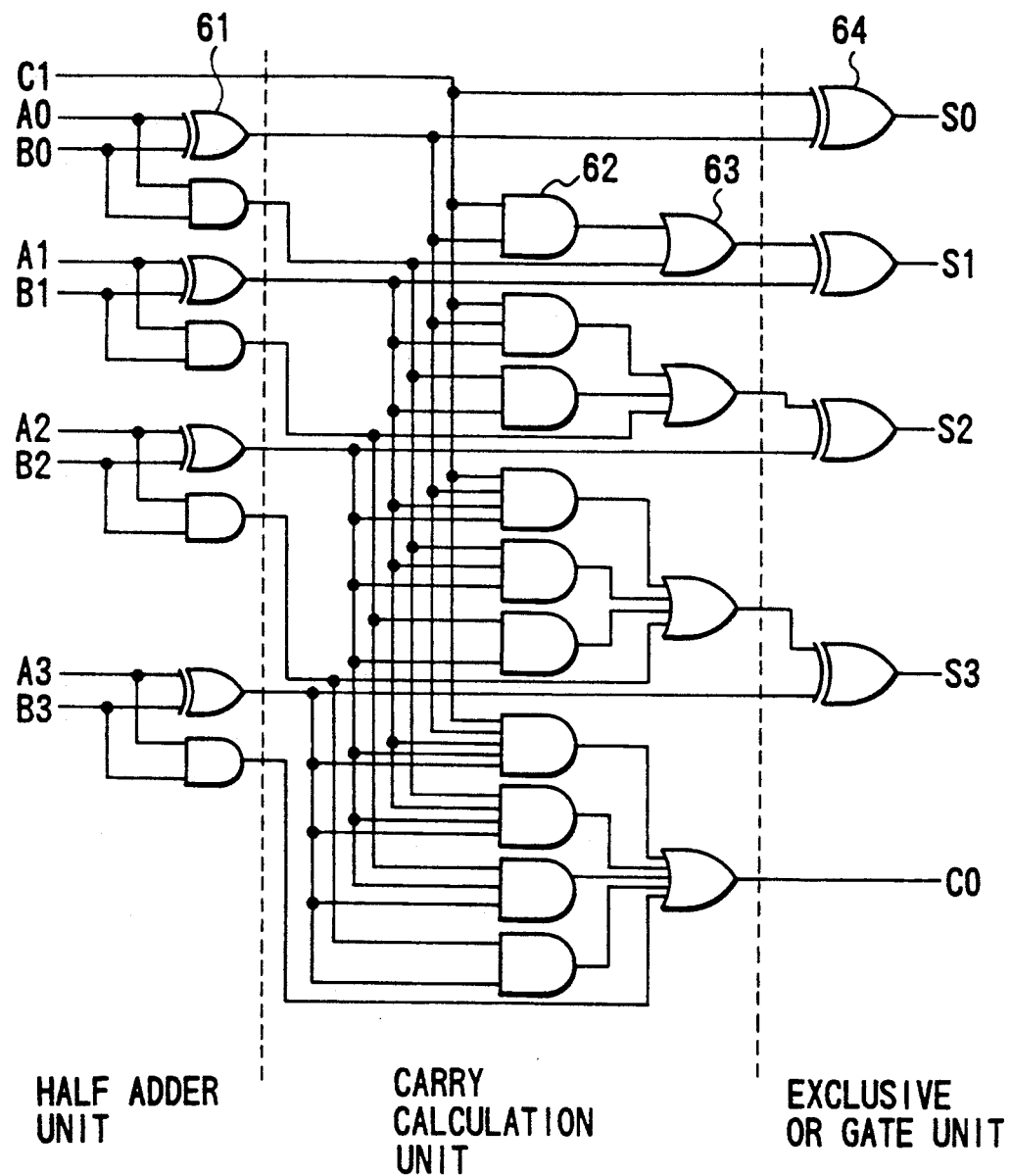
FIG. 5 is a system diagram showing the detailed circuit of the embodiment shown in FIG. 3.

A carry lookahead adder unit shown in FIG. 5 comprises a half adder unit 61, carry calculation units 62 and 63, and an exclusive OR unit 64.

A case in which the iterative pseudorandom pattern generator 20 is applied to the above carry lookahead adder model will be described below.

FIG. 6 explains an iterative pseudorandom pattern generator according to the second embodiment of the present invention. The iterative pseudorandom pattern generator 20 comprises a 17-bit output linear feedback shift register 71 (17-bit LFSR). The iterative pseudorandom pattern generator for this carry lookahead adder connects one of the seventeen output bits to the carry input pin 53. The remaining sixteen bits are used for the iterative pseudorandom pattern generator, and a pseudorandom pattern generated by this generator is iteratively supplied to sixteen data input units 55 (FIG. 4) of the two of the carry lookahead adder units $51_1$ to $51_8$ through a pseudorandom pattern output unit 74. The carry input pin 53 is arranged in the same manner as in FIG. 4.

In this embodiment, a pseudorandom pattern is iteratively supplied every two carry lookahead adder units due to the following reason. If the pseudorandom pattern is iteratively supplied every carry lookahead adder unit, each carry lookahead adder unit can be independently tested, but a coupling test between the carry lookahead adder units cannot be performed in the same manner as in the ripple carry adder. Although the amount of hardware can be reduced, an undetectable fault occurs.

The number of input bits of the 32-bit carry lookahead adder is 65. If a normal pseudorandom pattern generator is used, a 65-bit linear feedback shift register is required. However, when an iterative arrangement is utilized, only the 17-bit linear feedback shift register is required.

The embodiments in which the iterative pseudorandom pattern generators are applied as two typical adders have been described. However, if an iterative logic circuit is to be arranged, an iterative pseudorandom pattern generator is effective for an arithmetic logic unit (ALU) having a more complicated arrangement than that of an adder, as a circuit in which identical functional modules are linearly arranged, or for a multiplier or the like as a circuit in which identical modules are arranged in the form of an array.

Note that the iterative pseudorandom pattern generator can be applied to a 16-bit arithmetic logic unit having 25 functions such as arithmetic, logic, comparison functions and an overflow detection function or a 16-bit multiplier employing a second-order booth algorithm and a carry save adder scheme, and a simulation is performed to obtain a pattern generator having a high fault coverage with a small amount of hardware (25% to 60%) and a smaller number of patterns (10% to 40%).

The bit widths of the pseudorandom pattern generators required for the 32-bit ripple carry adder and the 32-bit carry lookahead adder which are exemplified in the above two embodiments are 5 bits and 17 bits, respectively. These bit widths can be, respectively, 7.7% and 26.2% that of the conventional method using the pseudorandom pattern generators, the number of which is equal to the number of inputs to the adder.

The bit widths of these pseudorandom pattern generators are not changed by the number of modules having identical functions, i.e., the bit width of the adder. When a 64- or 128-bit adder is taken into consideration, the iterative pseudorandom pattern generator can be arranged using the pseudorandom pattern generators constituting the above bit width, thereby greatly reducing the amount of hardware.

A relationship between the number of patterns and fault coverages in an actual fault simulation for the model using the iterative pseudorandom pattern generator (FIG. 3) of the present invention and the model using the pseudorandom pattern generators having the bit width corresponding to the number of inputs of the conventional technique in ripple carry adders is shown in Table 1.

TABLE 1

| Comparison in Fault Coverage Between Ripple Carry Adders | | |
|---|---|---|
| Number of Patterns | Fault Coverage of Pseudorandom Pattern Generator of Conventional Technique (%) | Fault Coverage of Iterative Pseudorandom Pattern Generator according to the Present Invention (%) |
| 10 | 42.84 | 97.06 |
| 20 | 47.43 | 100.00 |
| 50 | 61.19 | 100.00 |
| 100 | 67.89 | 100.00 |
| 200 | 67.89 | 100.00 |
| 500 | 89.00 | 100.00 |
| 1000 | 100.00 | 100.00 |

A relationship between the number of patterns and fault coverages in an actual fault simulation for the model using the iterative pseudorandom pattern generator (FIG. 6) of the present invention and the model using the pseudorandom pattern generators having the bit width corresponding to the number of inputs of the conventional technique in carry lookahead adders is shown in Table 2.

TABLE 2

| Comparison in Fault Coverage Between Carry Lookahead Adders | | |
|---|---|---|
| Number of Patterns | Fault Coverage of Pseudorandom Pattern Generator of Conventional Technique (%) | Fault Coverage of Iterative Pseudorandom Pattern Generator according to the Present Invention (%) |
| 10 | 34.46 | 44.37 |
| 20 | 37.52 | 57.65 |
| 50 | 46.70 | 90.45 |
| 100 | 51.16 | 98.04 |
| 200 | 51.29 | 99.82 |
| 500 | 69.40 | 100.00 |
| 1000 | 89.72 | 100.00 |
| 2000 | 97.00 | 100.00 |

TABLE 2-continued

Comparison in Fault Coverage
Between Carry Lookahead Adders

| Number of Patterns | Fault Coverage of Pseudorandom Pattern Generator of Conventional Technique (%) | Fault Coverage of Iterative Pseudorandom Pattern Generator according to the Present Invention (%) |
| --- | --- | --- |
| 5000 | 100.00 | 100.00 |

As can be apparent from Tables 1 and 2, the number of patterns for obtaining the 100% fault coverage in the iterative pseudorandom pattern generator is 2% for the ripple carry adder and about 10% for the carry lookahead adder as compared with the pseudorandom pattern generators of the conventional method. The test time in the manufacturing test can be shorted, and the fault simulation time for evaluating the patterns generated by the pattern generators can be greatly reduced.

As has been described above, according to the present invention, when an iterative pseudorandom pattern generator is applied to a multiple input circuit having an iterative logic arrangement, a linear feedback shift register requires a smaller bit width than that of the conventional linear feedback shift registers having an input bit width. In addition, test hardware can be reduced.

The fault detection capacity per pattern can be increased by supplying an iterative pseudorandom pattern to a circuit under test. The number of patterns supplied to the circuit under test can be reduced to achieve high fault coverage. The manufacturing test time can be shortened, and the fault simulation time for evaluating the pattern can be saved.

Referring to FIG. 1, the circuit comprises space compressors $13_1$ to $13_3$ respectively embedded in functional blocks $12_1$ to $12_3$ of a circuit under test 12, a space compressor 14 embedded in the functional block $12_1$, a compression line switching logic circuit 16 having a mode for switching the compression lines from the functional blocks $12_1$ to $12_3$ arranged independently of the functional blocks, a time compressor 17, and a wiring area 15 for connecting the space compressors $13_1$ to $13_3$ and 14 to the compression line switching logic circuit 16 and the time compressor 17. The time compressors $13_1$ to $13_3$ comprises compressors each using exclusive OR gates, the space compressor 14 comprises a compressor using a multiple input linear feedback shift register (MISR), and the time compressor 17 is a compressor using a multiple input feedback shift register (MISR). Reference numeral 18 denotes a comparator for comparing an output from the time compressor 17 with an output from an expected value generator 19 and outputting a comparison result.

The arrangement of the space compressor will be described in detail below.

Figure 7:
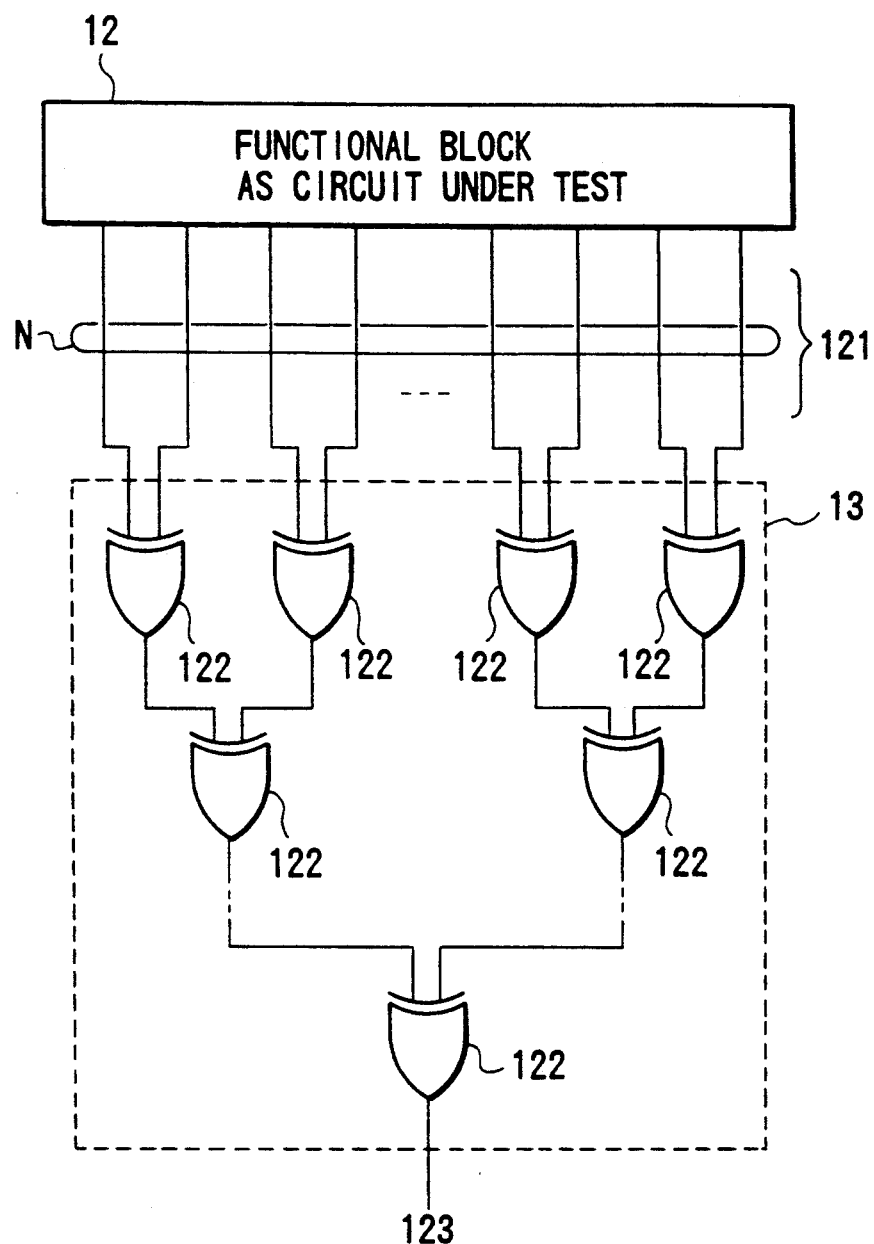
FIG. 7 is a circuit diagram showing a detailed arrangement of a compressor shown in FIG. 1.
Figure 8:
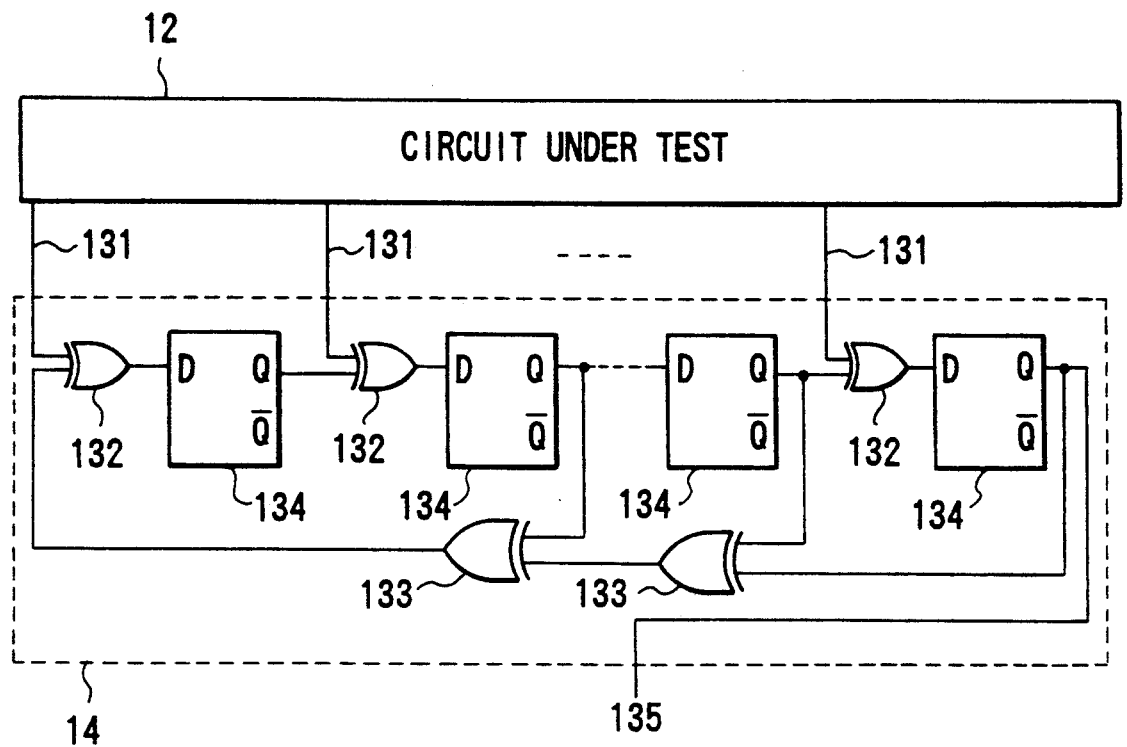
FIG. 8 is a circuit diagram showing another embodiment of a space compressor.

(1) Applications of the space compressors based on the natures of the functional blocks will be described with reference to FIGS. 7 and 8.

The space compressor is a compressor having a function of compressing input data of N bits (N is the number of outputs of the functional block) × M patterns (M is the number of test patterns) output from each functional block of the circuit under test 12 into output data of L (L is the number of outputs from the compressor; M>L)×M patterns. The detailed arrangement of the space compressor is a space compressor 13 (FIG. 7) in which exclusive OR gates, exclusive NOR gates, or NAND gates are arranged in a tree or cascade shape, or a space compressor 14 (FIG. 8) comprising a multiple input feed back shift register having a plurality of exclusive OR gates 132 and 133 and shift registers 134. Referring to FIG. 7, reference numerals 121 denote compressor input lines; 122, exclusive OR gates constituting the tree shape; and 123, a compression line for the compressor output. Referring to FIG. 8, reference numerals 131 denote compressor input lines; 135, a compression line for the compressor output.

The compressor 13 using the exclusive OR gates is characterized in that an amount of hardware is small, but a missed fault occurs depending on the nature of a circuit under test when the degree of space compression is increased (i.e., L is reduced). The compressor 14 using the multiple input feedback shift register is characterized in that the amount of hardware is large, but a missed fault rarely occurs even in a degree of one output regardless of the type of circuit because the pattern is compressed while being convoluted as a function of time.

According to the present invention, space compression is performed using the compressor $13_1$ using the exclusive OR or NOR gates to a degree in which a missed fault does not occur. Thereafter, the compressor 14 using the multiple input linear feedback shift register is used to perform space compression to one output. In this manner, the present invention employs the two-stage arrangement.

However, even if the space compressor using the exclusive OR gates is used, a missed fault does not occur to a degree in which space compression is performed up to one output, depending on the type of functional block, the space compressor $13_3$ using only the exclusive OR gates is used (a functional block having this nature is a circuit $12_3$ having a nature A).

The wiring area 15 obtained when a missed fault does not occur even in space compression into several compression lines using the space compressor using the exclusive OR gates and when these several compression lines are coupled up to the time compressor is compared with an amount of hardware obtained by compressing outputs to one output by a compressor unit consisting of the space compressor using the exclusive OR gates and the compressor having the multiple input linear feedback shift register. The space compressor $13_2$ using only the exclusive OR gates is used for a circuit under test exhibiting a smaller amount of hardware of the latter case than that of the former case (i.e., a functional block satisfying this nature is defined as a circuit $12_2$ having a nature B, and a functional block which belongs to neither circuits is defined as a circuit $12_1$ having a nature C).

According to the present invention, compressors having different arrangements such as the space compressor 13 having the exclusive OR gates and the space compressor 14 having the multiple input linear feedback shift register are combined in a multistage manner depending on the natures of the functional blocks as circuits under test, thereby reducing the amount of hardware constituting the space compressor.

The amount of hardware of the space compressor having the exclusive OR gates for compressing an input having n bits into one output is compared with that of the space compressor having the multiple input linear feedback shift register. The compressor having the exclusive OR gates requires (n−1) exclusive OR gates 122, as shown in FIG. 7, while the compressor having the multiple input linear feedback shift register requires the exclusive OR gate 132 and the shift register 134 for each input 131, as shown in FIG. 8. In addition, the compressor having the multiple input linear feedback shift register also requires several other exclusive OR gates 133 for performing linear feedback.

As described above, the compressor having the exclusive OR gates can be arranged using the (n−1) exclusive OR gates, while the compressor having the multiple input linear feedback shift register requires n exclusive OR gates and several additional exclusive OR gates, and n shift registers. If the amount of hardware of the shift register is about three times that of the exclusive OR gate, the space compressor having only the exclusive OR gates can be realized by an amount of hardware which is about ¼ or less that of the space compressor having the multiple input linear feedback shift register.

(2) The effect of the space compressor having only the exclusive OR gates on the basis of the nature of the functional block will be described below.

In the circuit $12_3$ having the nature A, an influence of a fault occurring inside the circuit under test propagates at random, and bit faults of a test output pattern independently occur with equal probabilities.

A theoretical, quantitative ground for the circuit $12_3$ having the nature A almost free from a missed fault in use of the space compressor having only the exclusive OR gates will be explained below.

When the space compressor is not used, the fault coverage and the number of pseudorandom patterns input to a circuit under test are given as FC and P, respectively, the following equation is given:

$$FC = f(P) \tag{1}$$

so that a function f given by the above equation is defined as a fault detection function.

The theoretical formula of the fault coverage for a model in which a change in fault coverage is given by this fault detection function is obtained when the space compressor having only the exclusive OR gates is used.

An influence of a fault occurring inside the circuit under test propagates at random to the output and the bit faults of the test output pattern independently occur with equal probabilities, a probability Pmiss in which a fault detected at the t-th pattern in the absence of the space compressor is missed in the number of patterns x in the presence of the space compressor having only the exclusive OR gates is represented as follows if n is the number of outputs of the space compressor:

$$P\text{miss} = \left(\frac{1}{2^n}\right)^{\frac{x}{t}} \quad (x \geq t) \tag{2}$$

Since a rate of faults detected by the number of patterns t is given by differentiating the fault detection function f, the fault miss probability Rmiss for the faults detected at the t-th pattern in the absence of the space compressor in the number of patterns x compressed by the space compressor having only the exclusive OR gates is represented by (rate of faults to be detected)×(fault miss probability), so that:

$$R\text{miss}(t) = \frac{df(t)}{dt} \times \left(\frac{1}{2^n}\right)^{\frac{x}{t}} \tag{3}$$

A total missed fault coverage FCmiss is given as a total sum of the fault miss probability of the respective numbers of patterns, so that $$FC\text{miss}(x) = \int \left\{ \frac{df(t)}{dt} \times \left(\frac{1}{2^n}\right)^{\frac{x}{t}} \right\} dt \tag{4}$$

Therefore, a fault coverage FC' in use of the space compressor having only the exclusive OR gates is defined as follows:

$$\begin{aligned} FC'(x) &= f(x) - FC\text{miss}(x) \\ &= f(x) - \int \left\{ \frac{df(t)}{dt} \times \left(\frac{1}{2^n}\right)^{\frac{x}{t}} \right\} dt \end{aligned} \tag{5}$$

A model in which the fault coverage is exponentially increased and the 100% fault coverage is obtained by 100 patterns is taken into consideration as an empirical fault detection function:

$$f(x) = \begin{cases} \frac{1}{2} \times \log_{10} x & (1 < x < 100) \\ 1 & (100 \leq x) \end{cases} \tag{6}$$

The comparison between the fault coverages FC in the absence of the space compressor and the fault coverages FC' in the presence of the space compressor using only the exclusive OR gates to obtain only one output is shown in Table 3.

TABLE 3

| Number of Patterns | Fault Coverage FC in the absence of Space Compressor (%) | Fault Coverage FC' in the presence (One Output) of Space Compressor (%) |
|---|---|---|
| 10 | 50.00 | 42.22 |
| 20 | 65.05 | 57.51 |
| 50 | 84.95 | 77.51 |
| 100 | 100.00 | 92.65 |
| 200 | 100.00 | 97.69 |
| 500 | 100.00 | 99.86 |
| 1000 | 100.00 | 99.998 |

The fault coverage FC' for the 100 patterns is 92.65%, and missed faults are figured out as about 7%. However, when the number of patterns is increased to 200, 500, and 1,000, the fault coverages FC' are increased to 97.69%, 99.86%, and 99.998%, respectively. In this manner, circuits satisfying the condition that the influences of faults occurring inside the circuits propagate at random to the outputs have extremely low missed fault coverages by increasing the number of patterns.

A 16-bit carry lookahead 2-input adder is exemplified as the circuit $12_3$ having the nature A. Comparison between the fault coverages FC in the absence of the space compressor and the fault coverages FC' in the presence of the space compressor using only the exclusive OR gates to obtain only one output is shown in Table 4.

TABLE 4

| Number of Patterns | Fault Coverage FC in the absence of Space Compressor (%) | Fault Coverage FC' in the presence (One Output) of Space Compressor (%) |
| --- | --- | --- |
| 10 | 33.70 | 27.58 |
| 20 | 38.58 | 35.52 |
| 50 | 44.71 | 44.43 |
| 70 | 46.52 | 46.52 |
| 100 | 62.26 | 62.26 |
| 200 | 73.82 | 73.82 |
| 500 | 97.08 | 96.38 |
| 700 | 100 | 100 |

As shown in Table 4, the 100% fault coverage is achieved for the carry lookahead adder when the space compressor having only the exclusive OR gates to obtain only one output is used. As compared with the absence of the space compressor, the number of patterns for the 100% fault coverage is almost the same. As compared with the theoretical curve, the missed fault coverage becomes extremely low. The carry lookahead adder is arranged in a bit slice manner, so that the influence of the fault tends to be concentrated on one output.

A 16-bit arithmetic logic unit is exemplified as the circuit $12_2$ having the nature B. The arithmetic logic unit has 16 data outputs and 4 control outputs. Changes in fault coverages obtained when any space compressor is used, a space compressor is used to compress data outputs to one output, and a space compressor is used to compress both data and control outputs to one output, are shown in Table 5.

TABLE 5

| Number of Patterns | Fault Coverage in the absence of Space Compressor (%) | Fault Coverage in the presence of Space Compressor (Data Outputs Compressed to One Output) (%) | Fault Coverage in the presence of Space Compressor (Both Data and Control Outputs Compressed to One Output) (%) |
| --- | --- | --- | --- |
| 10 | 60.14 | 58.08 | 53.35 |
| 20 | 72.67 | 71.63 | 68.00 |
| 50 | 89.97 | 88.87 | 85.44 |
| 100 | 97.38 | 96.84 | 95.50 |
| 200 | 98.66 | 98.45 | 97.65 |
| 500 | 99.35 | 99.17 | 98.81 |
| 1000 | 99.40 | 99.40 | 99.08 |

Even if the data outputs are compressed into one output, the maximum fault coverage is not changed as compared with a case in which the space compressor is not used. The number of patterns to obtain this maximum fault coverage is not almost increased.

When both the data and control outputs are compressed into one output, some missed faults occur because an output pair having a strong correlation are present in the control outputs and the faults do not propagate at random. That is, when two outputs having an inverting relationship are spatially compressed for a fault at a given portion, this fault cannot be detected.

Since an assumption in the theoretical formula that the influence of a fault propagates at random to an output is established, the outputs from the space compressor can be compressed to one output. However, since outputs such as control outputs to which this assumption is not applied are present, outputs having a strong correlation must be independently spatially compressed. The number of outputs from the space compressor having only the exclusive OR gates must be two. In this embodiment, the amount of hardware obtained when the two outputs are further compressed into one output by the space compressor having the multiple input linear feedback shift register is compared with the wiring area obtained by coupling the two outputs to the time compressor. If the amount of hardware of the latter is smaller than that of the former, the space compressor has an arrangement for the circuit having the nature B.

Figure 9:
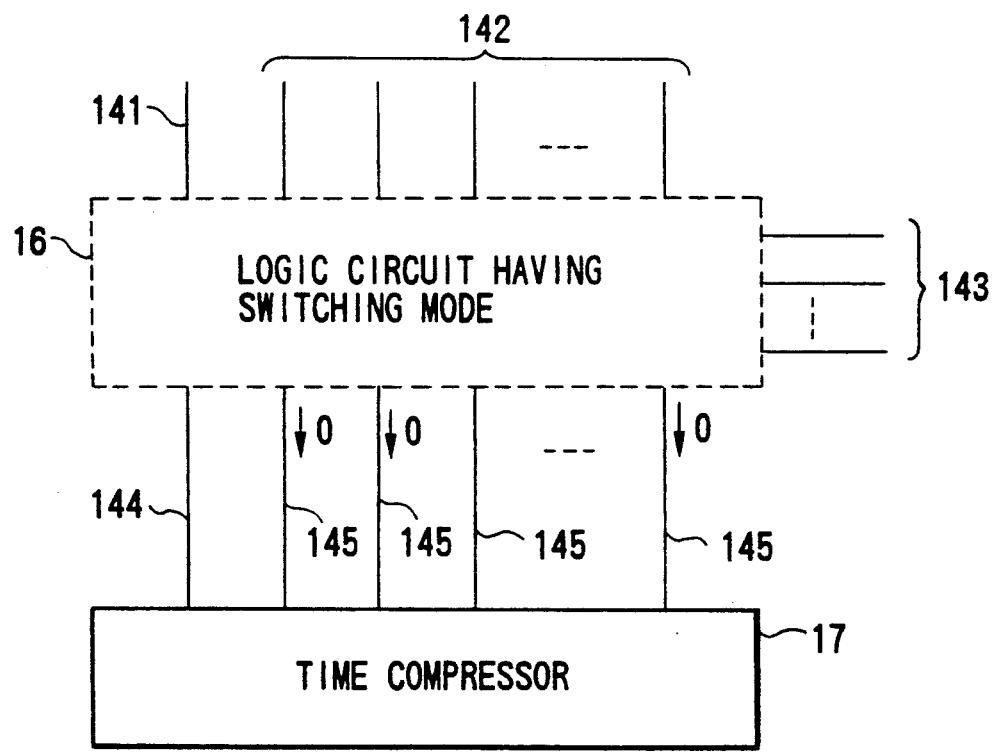
FIG. 9 is a system diagram showing an arrangement of a logic circuit having a mode for switching compression lines from the functional blocks.
Figure 10:
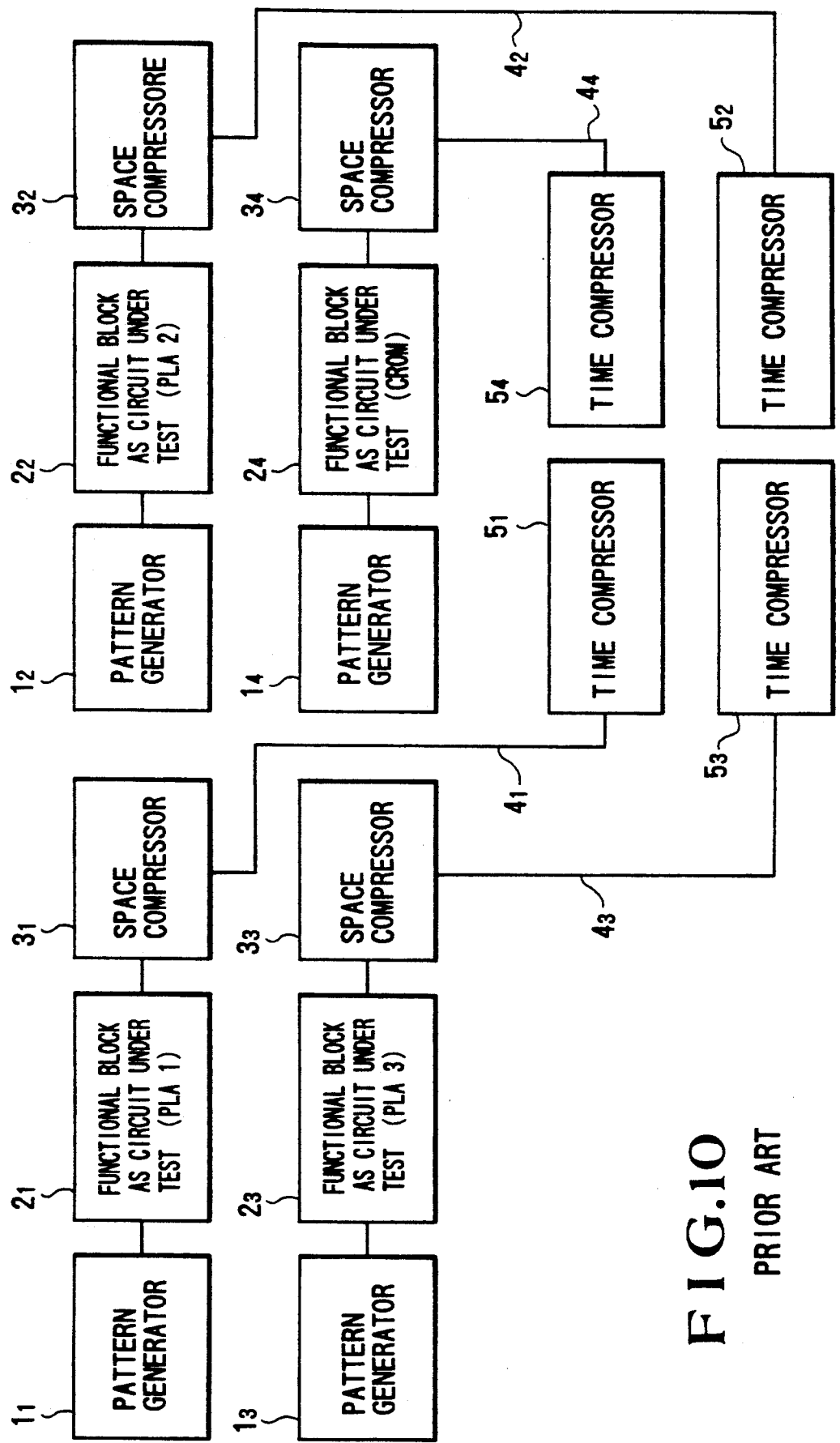
FIG. 10 is a block diagram showing an arrangement of a conventional built-in self test circuit.

(3) An arrangement of a logic circuit having a mode for switching compression lines from the respective functional blocks will be described with reference to FIG. 9.

The compression lines coupled from the functional blocks to the time compressor 17 are independent of each other in units of functional blocks. When the compression lines are independently subjected to time compression, a fault block can be separated. For this purpose, a logic circuit 16 has functions of a mode for sequentially supplying outputs from compression lines 141 and 144 coupled to fault functional blocks subjected to separation to a time compressor 17 independent of the functional blocks before outputs from the compression lines 141 and 142 compressed by the space compressors $13_1$ to $13_3$ respectively embedded in the functional blocks and for outputting fixed values to the remaining compression lines (142 and 145), and a mode for directly supplying the outputs from all the compression lines through the time compressor 17. The logic circuit 16 then switches between the above two modes through a control line 143. Referring to FIG. 9, the compression line 141 is a compression line from a fault functional block subjected to separation, the compression line 142 is a compression line from a block except for the fault functional block subjected to separation. Reference numeral 144 denotes an output directly from a compression line; 145, a fixed value output.

In the design, the mode for supplying the outputs from the compression lines coupled to the fault functional blocks subjected to separation to the time compressor 17 is set. Time compression is performed in units of the fault functional blocks subjected to separation, and the compressed outputs are compared with the expected value. The fault functional blocks are then separated. In the manufacture, the mode for supplying outputs of all the compression lines to the time compressor 17 is set, and all the outputs are simultaneously time-compressed. The compressed values are compared with the expected value, thereby effectively performing a GO/NO GO test.

(4) The arrangement of the time compressor will be described below.

The time compressor 17 is a compressor for compressing data of P bits (a total of compression line outputs through the space compressor from the functional blocks) × M patterns into data of P bits × one pattern. For this purpose, a multiple input (P-input) linear feedback shift register is used. The compressed data of P bits × one pattern is compared with the expected value having a P-bit width, and the comparison result is output.

As has been described above, according to the present invention, compressors having different arrangements, such as a compressor having only exclusive OR gates and a compressor using a multiple input linear feedback shift register are combined depending on the nature of the functional block as a circuit under test. The amount of hardware constituting the space compressor is reduced, and the number of wiring lines between the space compressor and the time compressor is reduced. The total amount of hardware of the pattern compressor is reduced in the arrangement of distributed built-in self test pattern compressor.

In addition, according to the present invention, a switching mode logic circuit having a mode for sequentially supplying compression line outputs from fault functional blocks subjected to separation to the time compressor and outputting a fixed value to the remaining compression lines is arranged. In the design test, a smaller amount of hardware is required as compared with a case in which time compressors are arranged in units of fault functional blocks subjected to separation. Switching control can be performed by setting only a logic value to the control line of the logic circuit, thus facilitating the test.

In the embodiment shown of FIG. 1, when the comparator 18 is built into an LSI, the test circuit can have a one-bit output. The number of external pins required in the test can be minimized. However, this comparator need not be built into the LSI and may be arranged outside the ISL. In this case, an output having a given bit width is externally extracted. This extraction method is a known method.

In FIG. 1, the output from the space compressor is supplied to the time compressor and the comparator to obtain a test result. However, a known test result determination circuit for determining whether a desired value is obtained on the basis of the output from the space compressor may be used.

What is claimed is:

1. A built-in self test circuit comprising:
a pattern generator;
a functional block subjected to a self test on the bases of an output from said pattern generator;
a space compressor for compressing a test result of said functional block; and
a comparator for comparing an output from said space compressor with an expected value and outputting a comparison result,
wherein said functional block includes a plurality of modules having the same function and has a data input bit width O (positive integer) and a data output bit width M (positive integer),
said pattern generator is constituted by a linear feedback shift register, having an output bit width P which is an integer satisfied by the equation $O/N <= P < O/(N+1)$ where N is an integer more than 2, for generating a pseudorandom pattern and an iterative pseudorandom pattern output unit for distributing outputs from said linear feedback shift register in units of N outputs and outputting, to said functional block, an iterative pseudorandom pattern output having an iterative O-bit width $(O=P*N)$ of the pseudorandom pattern output from said linear feedback shift register every P bits,
said space compressor has a function of spatially compressing the M outputs from said functional block into L outputs (positive integer and $M>L$), and
said pattern generator, said functional block, said space compressor, and said comparator are built into a semiconductor chip into which other functional elements are built.

2. A circuit according to claim 1, wherein said functional block is constituted by modules arranged in line and having the same function.

3. A circuit according to claim 1, wherein said functional block is constituted by modules arranged in the form of an array and having the same function.

4. A circuit according to claim 2, wherein said functional block comprises a control unit for supplying a control signal to each of said modules.

5. A circuit according to claim 1, wherein said space compressor constitutes one stage.

6. A circuit according to claim 1, wherein said space compressor constitutes a plurality of stages which are constituted by different types of space compressing means.

7. A circuit according to claim 6, wherein said space compressor constitutes two stages, the first one of which is constituted by an exclusive OR type and the second one of which is constituted by multiple input linear feedback shift register.

8. A built-in self test circuit comprising:
a plurality of pattern generators; and
a plurality of functional blocks subjected to a self test on the basis of outputs from said pattern generators;
a plurality of space compressors for compressing test results of said functional blocks;
a time compressor for comparing an output from said time compressor with an expected value and outputting a comparison result,
wherein each of said functional blocks includes a plurality of modules having the same function and has a data input bit width O (positive integer) and a data output bit width M (positive integer),
each of said pattern generators is constituted by a linear feedback shift register, having an output bit width which is an integer satisfied by the equation $O/N <= P < O/(N+1)$ where N is an integer more than 2, for generating a pseudorandom pattern and an iterative pseudorandom pattern output unit for distributing output from said linear feedback shift register in units of N outputs and outputting, to said functional block, an iterative pseudorandom pattern output having an iterative O-bit width $(O=P*N)$ of the pseudorandom pattern output from said linear feedback shift register every P bits,
each of said space compressors has a function of spatially compressing the M outputs from said functional block into L outputs (positive integer and $M>L$),
said time compressor receives an output from each of said space compressors and supplying a time-compressed output to said comparator, and
said plurality of pattern generators, said plurality of functional blocks, said plurality of space compressors, said time compressor, and said comparator are built into a semiconductor chip into which other functional elements are built.

9. A circuit according to claim 8, further comprising selecting means, arranged between said space compressors and said time compressor, for selecting outputs from said space compressors.

10. A built-in self test circuit comprising:
a pattern generator; and
a functional block subjected to a self test on the bases of an output from said pattern generator,
wherein said functional block includes a plurality of modules having the same function and has a data input bit width O (positive integer) and a data output bit width M (positive integer), said pattern generator is constituted by a linear feedback shift register, having an output bit width P which is an integer satisfied by the equation $O/N <= P < O/(N+1)$ where N is an integer more than 2, for generating a pseudorandom pattern and an iterative pseudorandom pattern output unit for distributing outputs from said linear feedback shaft register in units of N outputs and outputting, to said functional block, an iterative pseudorandom pattern output having an iterative O-bit width ($O=P*N$) of the pseudorandom pattern output from said linear feedback shift register every P bits, a test result is checked on the basis of an output from said functional block, and said pattern generator and said functional block are built into a semiconductor chip into which other functional elements are built.

* * * * *

UNITED STATES PATENT AND TRADEMARK OFFICE
CERTIFICATE OF CORRECTION

PATENT NO. : 5,301,199
DATED : April 5, 1994
INVENTOR(S) : Ikenaga et al

It is certified that error appears in the above-indentified patent and that said Letters Patent is hereby corrected as shown below:

| | | |
|---|---|---|
| Col. 03, line 30 | after "a" | insert --space-- |
| Col. 13, lines 52-53 | delete "more than 2" | insert --greater than 1-- |
| Col. 14, line 19 | after "by" | insert --a-- |
| Col. 14, lines 38-39 | delete "more than 2" | insert --greater than 1-- |
| Col. 15, lines 6-7 | delete "more than 2" | insert --greater than 1-- |
| Col. 10, line 58 | delete "97,69%" | insert --97.69%-- |
| Col. 13, lines 51-52 | delete "O/N < = P < O/(N+1)" | insert --O/N < = P < O/N+1-- |
| Col. 14, line 38 | delete "O/N < = P < O/(N+1)" | insert --O/N < = P < O/N+1-- |
| Col. 15, lines 5-6 | delete "O/N < = P < O/(N+1)" | insert --O/N < = P < O/N+1-- |

Signed and Sealed this

Twenty-fifth Day of October, 1994

Attest:

BRUCE LEHMAN

Attesting Officer

Commissioner of Patents and Trademarks